(12) United States Patent
Van Bommel

(10) Patent No.: US 11,913,608 B2
(45) Date of Patent: Feb. 27, 2024

(54) LED FILAMENT ARRANGEMENT

(71) Applicant: SIGNIFY HOLDING B.V., Eindhoven (NL)

(72) Inventor: Ties Van Bommel, Horst (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/034,812

(22) PCT Filed: Oct. 26, 2021

(86) PCT No.: PCT/EP2021/079666
§ 371 (c)(1),
(2) Date: May 1, 2023

(87) PCT Pub. No.: WO2022/096321
PCT Pub. Date: May 12, 2022

(65) Prior Publication Data
US 2023/0417374 A1   Dec. 28, 2023

(30) Foreign Application Priority Data
Nov. 3, 2020   (EP) ..................................... 20205440

(51) Int. Cl.
*F21K 9/232*   (2016.01)
*F21K 9/66*   (2016.01)
(Continued)

(52) U.S. Cl.
CPC ............... *F21K 9/232* (2016.08); *F21K 9/66* (2016.08); *H01L 25/0753* (2013.01);
(Continued)

(58) Field of Classification Search
CPC ....... F21K 9/232; F21K 9/66; H01L 25/0753; H01L 33/52–58
See application file for complete search history.

(56) References Cited

U.S. PATENT DOCUMENTS

| 9,967,943 B1 | 5/2018 | Wang et al. |
| 2005/0276553 A1 | 12/2005 | Kazakevich |

(Continued)

FOREIGN PATENT DOCUMENTS

| CN | 203850336 U | 9/2014 |
| CN | 205208156 U | 5/2016 |

(Continued)

*Primary Examiner* — Jason M Han

(57) ABSTRACT

A light emitting diode, LED, filament arrangement (100) comprising at least one LED filament (120) comprising a plurality of light emitting diodes, LEDs, (140). The LED filament arrangement further comprises a plurality of first sections (180) and a plurality of second sections (200), wherein the plurality of first sections (180) is configured to emit light of a first colour temperature, $CT_1$, and with a first intensity, $I_1$, during operation, and the plurality of second sections (200) is configured to emit light of a second colour temperature, $CT_2$, and with a second intensity, 12, during operation, wherein at least one of $CT_1 \neq CT_2$ and $I_1 \neq I_2$ is fulfilled, and wherein at least two second sections of the plurality of second sections are adjacently arranged and arranged at least partially parallel to each other.

11 Claims, 6 Drawing Sheets

(51) Int. Cl.
*F21Y 113/13* (2016.01)
*H01L 25/075* (2006.01)
*H01L 33/52* (2010.01)
*H01L 33/58* (2010.01)

(52) U.S. Cl.
CPC .............. *H01L 33/52* (2013.01); *H01L 33/58* (2013.01); *F21Y 2113/13* (2016.08)

(56) References Cited

U.S. PATENT DOCUMENTS

2007/0274648 A1  11/2007  Ip
2020/0212014 A1  7/2020  Chen et al.

FOREIGN PATENT DOCUMENTS

| DE | 202014001943 U1 | 5/2014 |
| EP | 3480510 A1 | 5/2019 |
| EP | 3684143 A1 | 7/2020 |
| WO | 2013082609 A1 | 6/2013 |
| WO | 2019197394 A1 | 10/2019 |
| WO | 2020190960 A1 | 9/2020 |
| WO | 2021018606 A1 | 2/2021 |

LED FILAMENT ARRANGEMENT

CROSS-REFERENCE TO PRIOR APPLICATIONS

This application is the U.S. National Phase application under 35 U.S.C. § 371 of International Application No. PCT/EP2021/079666, filed on Oct. 26, 2021, which claims the benefit of European Patent Application No. 20205440.9, filed on Nov. 3, 2020. These applications are hereby incorporated by reference herein.

FIELD OF THE INVENTION

The present invention generally relates to lighting arrangements comprising one or more light emitting diodes (LEDs). More specifically, the present invention is related to a LED filament arrangement.

BACKGROUND OF THE INVENTION

The use of light emitting diodes (LEDs) for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

Over the past years, various types of filaments and lamps using such filaments have been developed. An example of such filaments is an LED filament. One of the trends in such filaments is colour temperature and intensity tunability. The tuneable filaments are capable of emitting light with different colour temperatures and intensities.

However, there is a wish to provide alternatives for the LED filament arrangements of today, in particular LED filament arrangements providing a decorative light pattern.

Hence, it is an object of the present invention to provide alternatives to LED filament lamps of the prior art in order to provide more decorative lighting patterns.

SUMMARY OF THE INVENTION

Hence, it is of interest to explore the possibility of combining one or more of the numerous advantages of LED filament arrangements comprising LEDs, whilst improving the appearance and/or the decorative aspect of the LED filaments.

This and other objects are achieved by providing a LED filament arrangement and a LED filament system having the features in the independent claims. Preferred embodiments are defined in the dependent claims.

Hence, according to the present invention, there is provided a light emitting diode, LED, filament arrangement. The LED filament arrangement comprises at least one LED filament comprising a plurality of light emitting diodes, LEDs. The LED filament arrangement further comprises a plurality of first sections of the at least one LED filament, wherein the plurality of first sections is configured to emit light of a first colour temperature, $CT_1$, and with a first intensity, $I_1$, during operation. The LED filament arrangement further comprises a plurality of second sections of the at least one LED filament, wherein the plurality of second sections is configured to emit light of a second colour temperature, $CT_2$, and with a second intensity, $I_2$, during operation, wherein at least one of $CT_1 \neq CT_2$ and $I_1 \neq I_2$ is fulfilled, and wherein at least two second sections of the plurality of second sections are adjacently arranged and arranged at least partially parallel to each other.

Thus, the present invention is based on the idea of providing a LED filament arrangement comprising one or more LED filaments which in turn comprise(s) a plurality of first sections and a plurality of second sections. As at least two second sections of the LED filament(s) are arranged adjacently and at least partially parallel, wherein the light emitted by the plurality of second sections differ from the light emitted by the plurality of first sections, the LED filament arrangement may provide a decorative and aesthetically appealing light effect during operation.

It will be appreciated that the LED filament arrangement may provide a lighting pattern created by the arrangement of the plurality of second sections and by the difference in the emitted light from the plurality of second sections and from the plurality of first sections. Notably, the difference in the emitted light is achieved by the plurality of first sections providing light of a first colour temperature and a first intensity, while the plurality of second sections may provide light of a second colour temperature and a second intensity, wherein the second colour temperature and the second intensity are different from the first colour temperature and the first intensity, respectively. It will be further appreciated that the plurality of second sections of the LED filament(s) are arranged in a manner resembling lines. For example, the plurality of second sections may be arranged in a linear fashion that extends in a direction perpendicular to the direction of elongation of the at least one LED filament. It is to be understood that the plurality of second sections may be arranged in one or more continuous patterns. For example, the plurality of second sections of at least one LED filament may be arranged into a pattern of a plurality of separate parallel lines.

The present invention is further advantageous in that the numerous advantages of using LED technology may be combined with the attractiveness and the appealing properties of the LED filament arrangement as disclosed.

The present invention is further advantageous in that the arrangement of the plurality of first and/or second sections of the LED filament(s), as well as the emitted light from the plurality of first and second sections, may vary to create different patterns. The patterns created by the arrangement of the plurality of second sections and the difference in emitted light by the plurality of first and second sections, may have a decorative effect and/or have a practical use.

The LED filament arrangement comprises at least one LED filament. The LED filament provides LED filament light during operation and comprises a plurality of light emitting diodes (LEDs). Preferably, the LED filament has a length, L, and a width, W, wherein L>5 W. The LED filament(s) may be arranged in a linear (straight) configuration or in a non-linear (non-straight) configuration such as for example a curved configuration, a 2D/3D spiral or a helix. The LEDs may be arranged, mounted and/or mechanically coupled on/to a carrier or substrate of each LED filament, wherein the carrier or substrate is configured to support the LEDs. Preferably, the LEDs are arranged on an elongated carrier, e.g. a substrate, that may be rigid (made from e.g. a polymer, glass, quartz, metal or sapphire) or flexible (e.g. made of a polymer or metal e.g. a film or foil). In case the carrier comprises a first major surface and an opposite second major surface, the LEDs are arranged on at least one of these surfaces. The carrier may be reflective or light transmissive, such as translucent and preferably transparent.

The at least one LED filament of the LED filament arrangement further comprises a plurality of first sections. By the term "sections" it is here meant, but not limited to, parts, segments or portions of the at least one LED filament. All sections of the same group, e.g. the first sections, substantially emits the same light characteristics in terms of colour temperature and intensity. The plurality of first sections may be sections of the at least one LED filament that are configured to emit light with a first colour temperature, $CT_1$, and a first intensity, $I_1$, during operation. The plurality of first sections may be the part remaining of the at least one LED filament that does not comprise the plurality of second sections. It is to be understood that the dimensions and size of the plurality of first sections may vary.

The at least one LED filament of the LED filament arrangement further comprises a plurality of second sections. The plurality of second sections may be sections of the at least one LED filament that are configured to emit light with a second colour temperature, $CT_2$, and a second intensity, $I_2$, during operation. The colour temperature of the light emitted from the plurality of first and second sections may be different, i.e. $CT_1 \neq CT_2$, and/or the intensity of the light emitted from the plurality of first and second sections may be different, i.e. Hence, the characteristics of the light in terms of colour temperature and/or intensity emitted by the plurality of first and second sections are different. It will be appreciated that the LED filament arrangement according to the present invention may be configured to emit light in many different ways. For example, the plurality of second sections may emit no light at all.

Furthermore, at least two second sections of the plurality of second sections are adjacently arranged and arranged at least partially parallel to each other. Hence, the plurality of second sections may be arranged in a manner in which two or more second sections of the plurality of second sections are adjacently arranged, i.e. alongside each other. Of these two or more second sections, there are at least parts thereof which are parallel with their neighbouring second sections. In this way, the LED filament arrangement may create a pattern resembling a line.

According to an embodiment of the present invention, at least one of $|CT_1-CT_2|>300$ K and one of $I_1/I_2<0.8$ and $I_1/I_2>1.2$ is fulfilled. Hence, the colour temperatures emitted from the plurality of first and second sections, $CT_1$ and $CT_2$, respectively, may differ by at least 300 K. Furthermore, the ratio of the intensities of the light emitted from the plurality of first and second sections, i.e. $I_1/I_2$, either fulfils $I_1/I_2<0.8$ or $I_1/I_2>1.2$. Hence, the intensities of the light emitted from the plurality of first and second sections differ during operation of the LED filament arrangement. The present embodiment is advantageous in that the difference between the light emitted from the plurality of first sections and the light emitted from the plurality of second sections is more visible for an observer. Furthermore, the present embodiment is advantageous in that the LED filament arrangement may provide a desired light distribution and/or a decorative effect.

According to an embodiment of the present invention, at least three second sections of the plurality of second sections are adjacently arranged and arranged at least partially parallel to each other. Hence, the plurality of second sections may be arranged in a manner in which three or more second sections (preferably at least four second sections, and even more preferred at least five second sections) of the plurality of second sections are adjacently arranged, i.e. alongside each other. Of these three or more second sections, there are at least parts thereof which are parallel with their neighbouring second sections. This is advantageous in that an even more distinct and/or continuous light pattern can be recognized from three second sections that are adjacently arranged and at least partially parallel.

According to an embodiment of the present invention, a number of LEDs, $dN_1$, per unit length, $dL_1$, of the plurality of first sections, $dN_1/dL_1$, and a number of LEDs, $dN_2$, per unit length, $dL_2$, of the plurality of second sections, $dN_2/dL_2$, fulfil $dN_1/dL_1 \neq dN_2/dL_2$. Hence, the concentration of LEDs in the plurality of first sections and the plurality of second sections may differ. For example, the concentration of LEDs in the plurality of second sections per unit length thereof may be higher than in the plurality of first sections, thus providing a more intense emitted light. It is to be understood that the concentration of LEDs in two second sections, or in two first sections, does not have to be the exact same, but may vary. The present embodiment is advantageous in that the LED filament arrangement may provide a desired light distribution and/or a decorative effect.

According to an embodiment of the present invention, the LED filament arrangement further comprises an encapsulant at least partially enclosing the plurality of LEDs, wherein the encapsulant comprises at least one of a luminescent material configured to at least partly convert light emitted from the plurality of LEDs and a light scattering material configured to scatter light emitted from the plurality of LEDs. Hence, the encapsulant of the LED filament arrangement may comprise a luminescent material and/or a light scattering material having the aforementioned features or characteristics. This is advantageous in that the LED filament arrangement may provide a desired light distribution and/or a decorative effect. An example of a decorative effect that can be achieved is that the emitted light from the LED filament arrangement may be experienced as softer by an observer.

According to an embodiment of the present invention, the encapsulant comprises a first encapsulant portion and a second encapsulant portion, wherein at least a first section of the plurality of first sections comprises the first encapsulant portion and at least a second section of the plurality of second sections comprises the second encapsulant portion. Hence, the plurality of first sections and the plurality of second sections can have, at least partially, a different encapsulant with different characteristics. This is advantageous in that the emitted light from the plurality of first sections and the plurality of second sections may differ, allowing the emitted light from the plurality of second sections to be distinguishable from the emitted light from the plurality of first sections. Consequently, an even more decorative lighting effect may be achieved.

According to an embodiment of the present invention, at least one of the following three possibilities is fulfilled. The first encapsulant portion may comprise a phosphor of a first phosphor type, $P_1$, and the second encapsulant portion may comprise a phosphor of a second phosphor type, $P_2$, wherein $P_1 \neq P_2$. The first encapsulant portion may comprise a first thickness, $T_1$, and the second encapsulant portion may comprise a second thickness, $T_2$, wherein $T_1 \neq T_2$. The first encapsulant portion may comprise a phosphor with a first phosphor concentration, $PC_1$, and the second encapsulant portion may comprise a phosphor with a second phosphor concentration, $PC_2$, wherein $PC_1 \neq PC_2$. The three different possibilities are all advantageous in that the emitted light from the plurality of first and second sections may differ. Hence, the LED filament arrangement may provide a desired light distribution and/or a decorative effect.

According to an embodiment of the present invention, at least two first sections of the plurality of first sections are adjacently arranged and arranged at least partially parallel to each other. Hence, the plurality of first sections may be arranged in a manner in which two or more first sections of the plurality of first sections are adjacently arranged, i.e. alongside each other. Of these two or more first sections, there are at least parts thereof which are parallel with their neighbouring first sections. According to an example, at least three first sections of the plurality of first sections are adjacently arranged and arranged at least partially parallel to each other. The present embodiment is advantageous in that the LED filament arrangement may provide a desired light distribution and/or an even more decorative effect.

According to an embodiment of the present invention, a width of at least one first section of the plurality of first sections $W_1$, and a width of at least one second section of the plurality of second sections $W_2$, may fulfil $W_2<W_1$.

According to an embodiment of the present invention, a length of at least one second section of the plurality of second sections, $L_2$, and a length of at least one first section of the plurality of first sections, $L_1$, fulfils $L_2<L_1$. The length of at least one second section of the plurality of second sections, $L_2$, and the length of at least one first section of the plurality of first sections more preferably fulfils $L_2<2L_1$, and most preferably fulfils $L_2<3L_1$. The present embodiment is advantageous in that the LED filament arrangement may provide a desired light distribution and/or a decorative effect.

According to an embodiment of the present invention, the length of the at least one second section of the plurality of second sections, $L_2$, fulfils $L_2<3$ cm. More preferably the length of the at least one second section of the plurality of second sections, $L_2$, fulfils $L_2<2$ cm, and most preferably $L_2$ fulfils $L_{2<1}$ cm. The present embodiment is advantageous in that the LED filament arrangement may provide a desired light distribution and/or a decorative effect.

According to an embodiment of the present invention, the LED filament arrangement further comprises a carrier arranged to support the at least one LED filament, wherein the at least one LED filament is arranged on the carrier. By the term "carrier" it is here meant, but not limited to, substantially any element, structure or object that can provide support for the LED filament arrangement and/or maintaining the arrangement of the at least one LED filament. The present embodiment is advantageous in that the carrier provides support for the at least one LED filament.

According to an embodiment of the present invention, at least one of the carrier and the at least one LED filament is flexible. Hence, the carrier and/or the LED filament(s) is (are) flexible. For example, the LED filament arrangement may have a curved carrier and curved LED filaments, wherein the LED filaments follow a surface of the curved carrier. A further example is that the at least one LED filament may be flexible and can be arranged on the carrier. The present embodiment is advantageous in that the LED filament arrangement may be easier to mount on uneven surfaces. The present embodiment is further advantageous in that the LED filament arrangement may provide a desired light distribution and/or decorative effect.

According to an embodiment of the present invention, the at least one LED filament is arranged in at least one of a linear configuration, a meander configuration, a spiral configuration and a sinusoidal configuration. Hence, the LED filament(s) comprise(s) a linear (straight) configuration, a meander configuration, a spiral configuration and/or a sinusoidal configuration. The present embodiment is advantageous in that the LED filament arrangement may provide a desired light distribution and/or a decorative effect.

According to an embodiment of the present invention, there is provided a lighting device. The lighting device may comprise a LED filament arrangement according to any one of the preceding embodiments of the present invention. The lighting device may further comprise a cover comprising an at least partially light-transmissive material, wherein the cover at least partially encloses the at least one LED filament. By the term "cover", it is here meant an enclosing element, such as a cap, cover, envelope, or the like, comprising an at least partial translucent and/or transparent material. The lighting device may further comprise an electrical connection connected to the at least one LED filament for a supply of power to the plurality of LEDs of the at least one LED filament.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
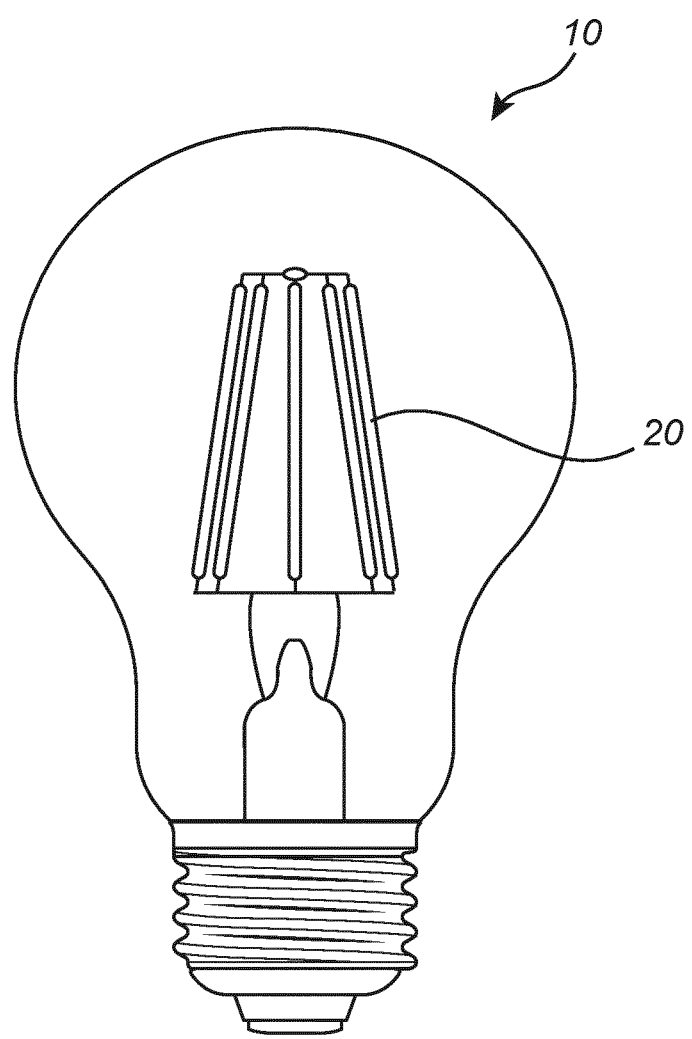
FIG. 1 shows a LED filament lamp 10 according to the prior art.

FIG. 1 shows a LED filament lamp 10 according to the prior art, comprising a plurality of LED filaments 20. LED filament lamps 10 of this kind are highly appreciated as they are very decorative, as well as providing numerous advantages compared to incandescent lamps such as a longer operational life, a reduced power consumption, and an increased efficiency related to the ratio between light energy and heat energy. LED filament lamps 10 of this kind are able to produce warm white light. However, it is of interest to improve the properties of the light emitted from the LED filaments 20 without impairing the appearance and/or the decorative aspect of the LED filaments 20 and/or the LED filament lamps 10.

Figure 2A:
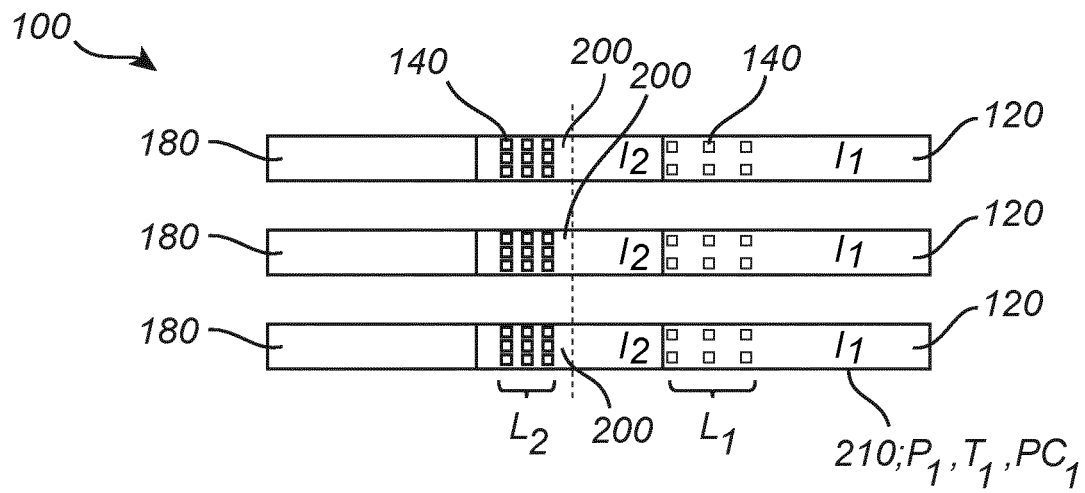
FIG. 2a shows a schematic view of at least one LED filament of a LED filament arrangement according to exemplifying embodiments of the present invention.
Figure 2B:
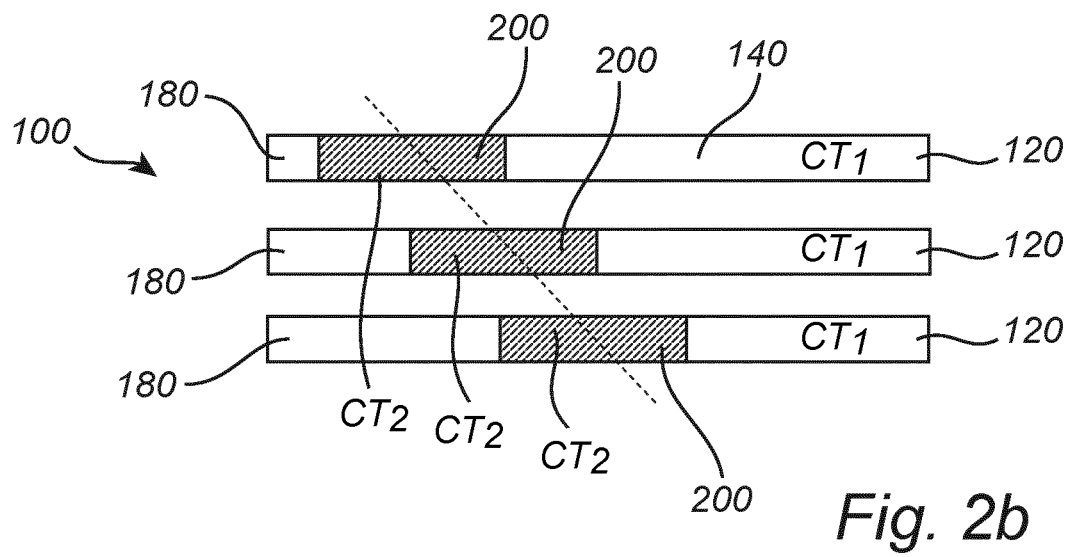
FIG. 2b shows a schematic view of at least one LED filament of a LED filament arrangement according to exemplifying embodiments of the present invention.

FIG. 2a-2b shows a LED filament arrangement 100 according to an exemplifying embodiment of the present invention. The LED filament arrangement 100 comprises at least one LED filament 120. Here, the LED filament arrangement 100 is exemplified as comprising three LED filaments 120, but it should be noted that the number of LED filaments 120 is arbitrary. The LED filaments 120 comprise a plurality of LEDs 140. The LED filaments 120 further comprise a plurality of first sections 180 and a plurality of second sections 200. In FIGS. 2a-2b, the plurality of first sections 180 and the plurality of second sections 200 are arranged in an alternating manner along the length of the respective LED filament 120. In FIGS. 2a-2b, at least two second sections of the plurality of second sections 200 are adjacently arranged and arranged at least partially parallel to each other.

In FIG. 2a, the plurality of first sections 180 are configured to emit light of a first intensity, $I_1$. The plurality of second sections 200 are configured to emit light of a second intensity, $I_2$, wherein $I_1 \neq I_2$ is fulfilled during operation of the LED filament arrangement 100. For example, $I_1/I_2 < 0.8$ may be fulfilled, and preferably $I_1/I_2 < 0.5$. Alternatively, $I_1/I_2 > 1.2$ may be fulfilled, and preferably $I_1/I_2 > 2$.

In FIG. 2a, the concentration of LEDs 140 in the plurality of first sections 180 and the plurality of second sections 200 differ. For example, the concentration of LEDs 140 in the plurality of second sections 200 per unit length thereof is higher than in the plurality of first sections 180, thus providing a more intense emitted light. The concentration of LEDs 140 may be described as a number of LEDs 140, $dN_1$, per unit length, $dL_1$, of the plurality of first sections 180, $dN_1/dL_1$, and a number of LEDs 140, $dN_2$, per unit length, $dL_2$, of the plurality of second sections 200, $dN_2/dL_2$, wherein $dN_1/dL_1 \neq dN_2/dL_2$ is fulfilled in FIG. 2a. For example, the ratio between $dN_1/dL_1$ and $dN_2/dL_2$ may be <0.8 or >1.2. Furthermore, a first width, $W_1$ (not shown) of the plurality of first sections 180, and a second width, $W_2$ (not shown) of the plurality of second sections 200, may fulfil $W_2 < W_1$.

The LED filament(s) 120 of the LED filament arrangement 100 in FIG. 2a further comprises an encapsulant 210 at least partially enclosing the plurality of LEDs 140. The encapsulant 210 comprises a luminescent material configured to at least partly convert light emitted from the plurality of LEDs 140 and/or a light scattering material configured to scatter light emitted from the plurality of LEDs 140. It will be appreciated that the plurality of first sections 180 and the plurality of second sections 200 can have, at least partially, a different encapsulant 210 with different characteristics. For example, the encapsulant 210 of the first sections 180 may comprise a phosphor of a first phosphor type, $P_1$, a first thickness, $T_1$, and a first phosphor concentration, $PC_1$, and the encapsulant 210 of the second sections 200 (not shown) may comprise a phosphor of a second phosphor type, $P_2$, a second thickness, $T_2$, and a second phosphor concentration, $PC_2$, wherein $P_1 \neq P_2$, $T_1 \neq T_2$ and/or $PC_1 \neq PC_2$.

In FIG. 2a, the plurality of second sections 200 are adjacently arranged and substantially parallel to each other. The plurality of second sections 200 are arranged to form a linear pattern, wherein the linear pattern is extending in a direction substantially perpendicular to the direction of extension of the at least one LED filament 120.

In FIG. 2b, the plurality of first sections 180 are configured to emit light of a first colour temperature, $CT_1$. The plurality of second sections 200 are configured to emit light of a second colour temperature, $CT_2$, wherein $CT_1 \neq CT_2$ is fulfilled during operation of the LED filament arrangement 100. For example, $|CT_1-CT_2|>300$ K may be fulfilled. Preferably, $|CT_1-CT_2|>500$ K, more preferably $|CT_1-CT_2|>600$ K and most preferably $|CT_1-CT_2|>700$ K. According to another example, in order to limit the difference in colour temperature, $|CT_1-CT_2|<2500$ K may be fulfilled. Preferably, $|CT_1-CT_2|<2000$ K, more preferably $|CT_1-CT_2|<1500$ K and most preferably $|CT_1-CT_2|<1200$ K.

In FIG. 2b, the plurality of second sections 200 are adjacently arranged and at least partially parallel to each other, wherein the plurality of second sections 200 are arranged to form a linear pattern. The linear pattern formed by the plurality of second sections 200 in FIG. 2b is extending in a direction diagonally to the direction of extension of the at least one LED filament 120. The linear pattern of the plurality of second sections 200 in FIG. 2B can be seen as a line crossing the at least one LED filament 120 diagonally.

The LED filament(s) 120 of the LED filament arrangements 100 of FIGS. 2a-b may further comprise an encapsulant (not shown) at least partly covering at least part of the plurality of LEDs 140. For example, the encapsulant may (continuously) cover the LEDs 140 of one or more first sections 180 of the LED filament(s) 120 and/or (continuously) cover the LEDs 140 of one or more second sections 200 of the LED filament(s) 120. The encapsulant may be a polymer material which may be flexible such as for example a silicone. Further, the plurality of LEDs 140 may be arranged for emitting LED light e.g. of different colours or spectrums. The encapsulant may comprise a luminescent material that is configured to at least partly convert LED light into converted light. The luminescent material may be a light-scattering material, e.g. a polymer matrix comprising $BaSO_4$, $Al_2O_3$ and/or $TiO_2$ particles. The luminescent material may be a phosphor such as an inorganic phosphor (e.g. YAG, LuAG, ECAS, KSiF, etc.) and/or quantum dots or rods. The phosphor may further be e.g. a (blue) green/yellow and/or red phosphor. The luminescent material may hereby be configured to convert e.g. UV LED light into blue converted light and/or UV/blue LED into green/yellow and/or red converted light. The LED filament(s) 120 may comprise multiple sub-filaments.

FIGS. 3a-3d show schematic views of a LED filament arrangement 100 according to an exemplifying embodiment of the present invention. The LED filament arrangement 100 comprises at least one LED filament 120. The LED filament 120 comprises a plurality of first sections 180 and a plurality of second sections 200, wherein the plurality of second sections 200 are aligned. Each second section of the plurality of second sections 200 is adjacently arranged to at least one second section, wherein the at least two second sections are arranged at least partially parallel to each other. The plurality of second sections 200 may be arranged to align in one or more linear patterns, wherein the at least one linear pattern of second sections may be straight or curved. In FIG. 3a-3d the emitted light from the plurality of second sections 200 is different than the emitted light from the plurality of first sections 180. The plurality of second sections 200 may also be configured to emit no light at all.

Figure 3A:
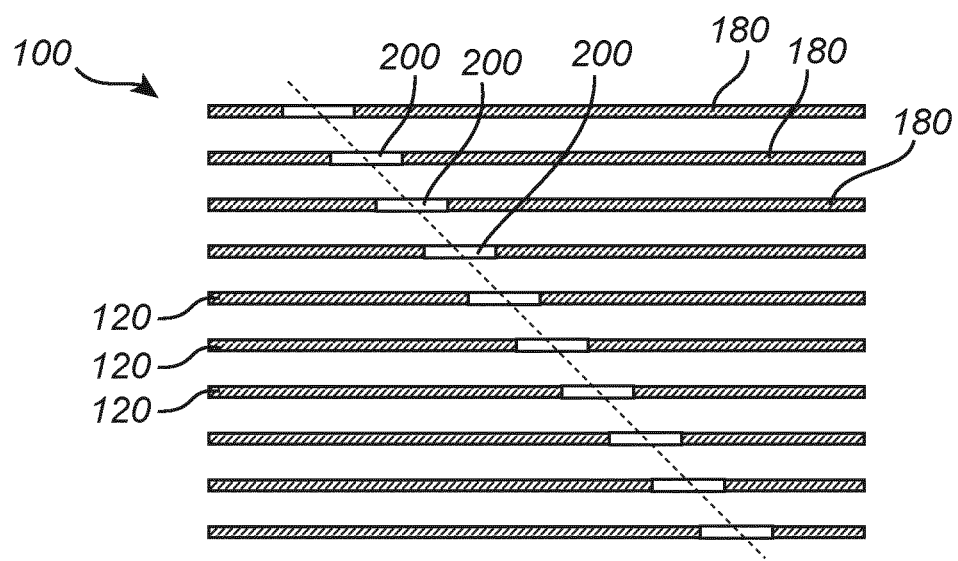
FIGS. 3a-3d schematically show LED filament arrangements according to exemplifying embodiments of the present invention.

In FIG. 3a, the LED filament arrangement 100 comprises at least one LED filament 120. The at least one LED filament 120 is arranged in a linear configuration, wherein the plurality of second sections 200 is arranged to form a pattern comprising a continuous line extending in a direction at least partially perpendicular to the direction of extension of the at least one LED filament 120.

Figure 3B:
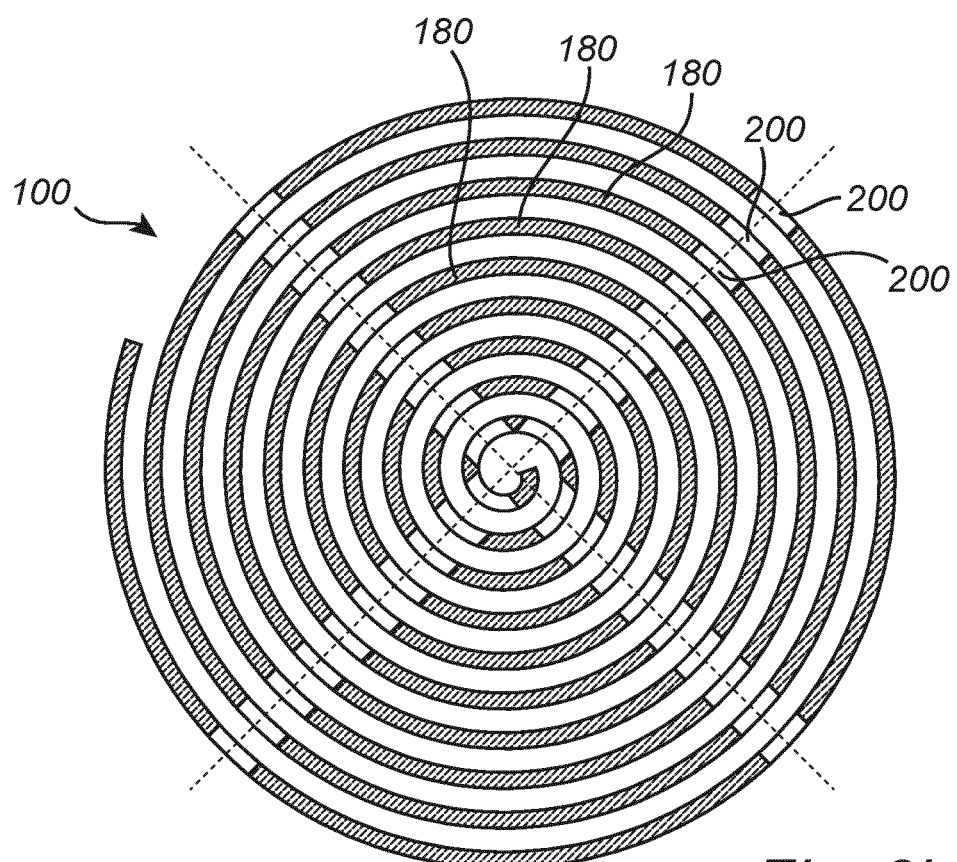

In FIG. 3b, the LED filament arrangement 100 comprises at least one LED filament 120. The at least one LED filament 120 is arranged in a spiral configuration, wherein the plurality of second sections 200 is arranged to form a pattern comprising two continuous lines, wherein the two continuous lines cross each other in the centre of the LED filament arrangement 100.

Figure 3C:
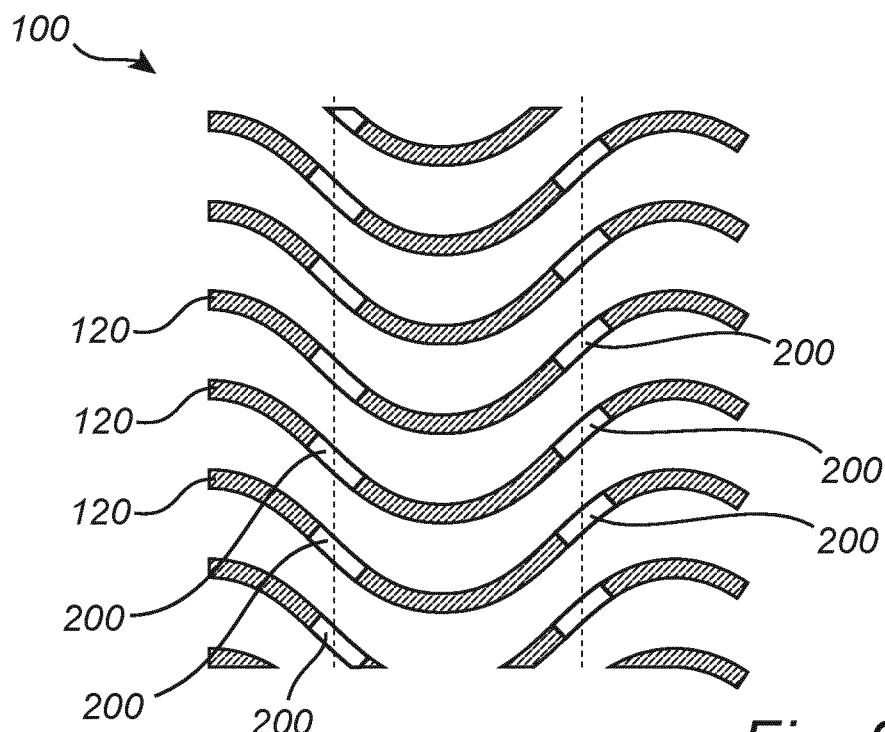

In FIG. 3c, the LED filament arrangement 100 comprises at least one LED filament 120. The at least one LED filament 120 is arranged in a sinusoidal configuration, wherein the plurality of second sections 200 is arranged to form a pattern comprising two continuous lines.

Figure 3D:
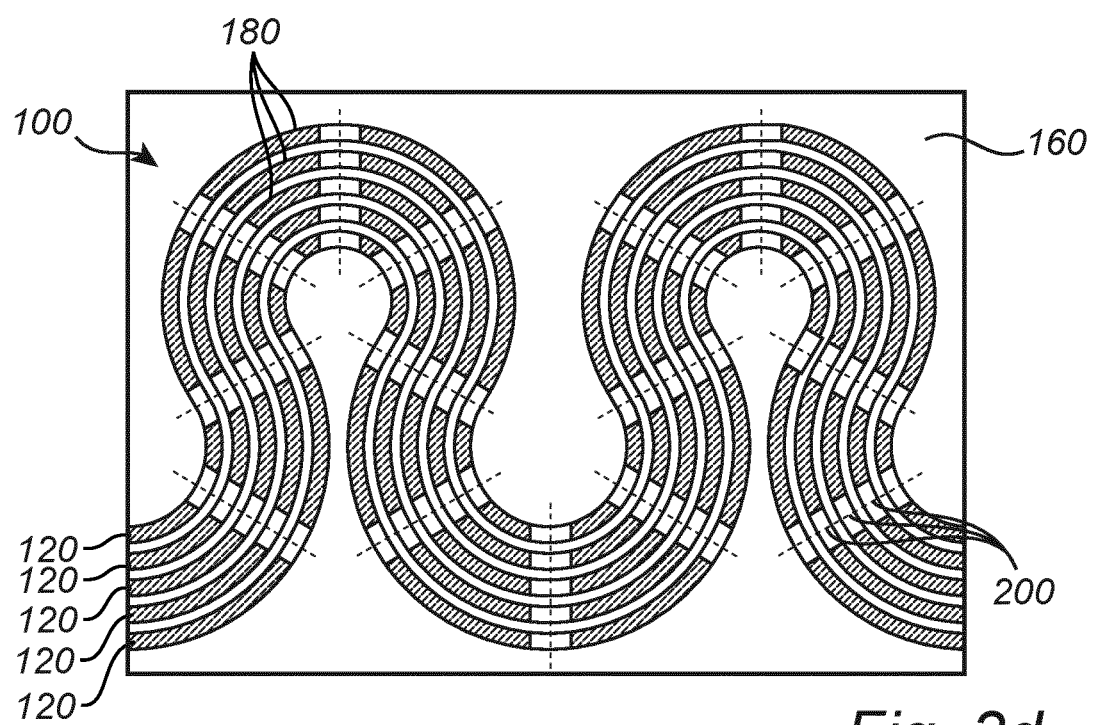

In FIG. 3d, the LED filament arrangement 100 comprises at least one LED filament 120. The at least one LED filament 120 is arranged in a meander configuration, wherein the plurality of second sections 200 is arranged to form a pattern comprising a plurality of continuous lines, wherein the plurality of continuous lines are substantially perpendicular to the direction of extension of the meander pattern. The meander pattern is created by the arrangement of the at least one LED filament 120 in a meander configuration. In FIG. 3d the LED filament arrangement 100 further comprises a carrier 160. It is to be understood that the carrier 160 may have a different size and different dimensions than shown in FIG. 3d, e.g. the carrier may have the shape of the contour of the LED filament arrangement 100. In other words, the shape of the carrier 160 may be similar to the shape of the LED filament arrangement 100. The carrier 160 may be a heat sink, wherein the carrier 160, in that case, is configured to dissipate heat from the at least one LED filament 120 during operation of the LED filament arrangement.

Figure 4A:
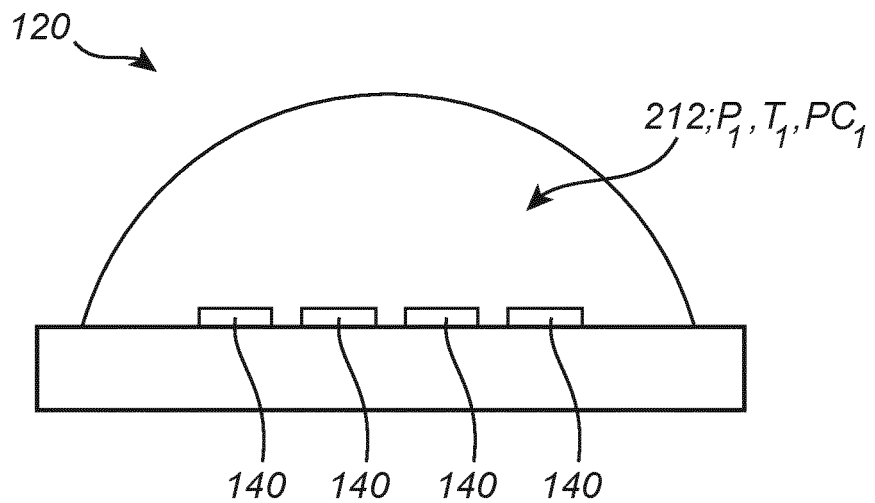
FIGS. 4a-4b show schematic views of a cross-section of at least one LED filament of a LED filament arrangement according to exemplifying embodiments of the present invention.

FIG. 4a shows a schematic view of a cross section of at least one LED filament 120 of the LED filament arrangement according to an exemplifying embodiment of the present invention. The at least one LED filament 120 comprises a first encapsulant portion 212. The first encapsulant portion 212 at least partially encloses the LEDs 140. The first encapsulant portion 212 has a first thickness, $T_1$. The first encapsulant portion 212 further comprises a phosphor of a first phosphor type, $P_1$, and of a first phosphor concentration, $PC_1$.

Figure 4B:
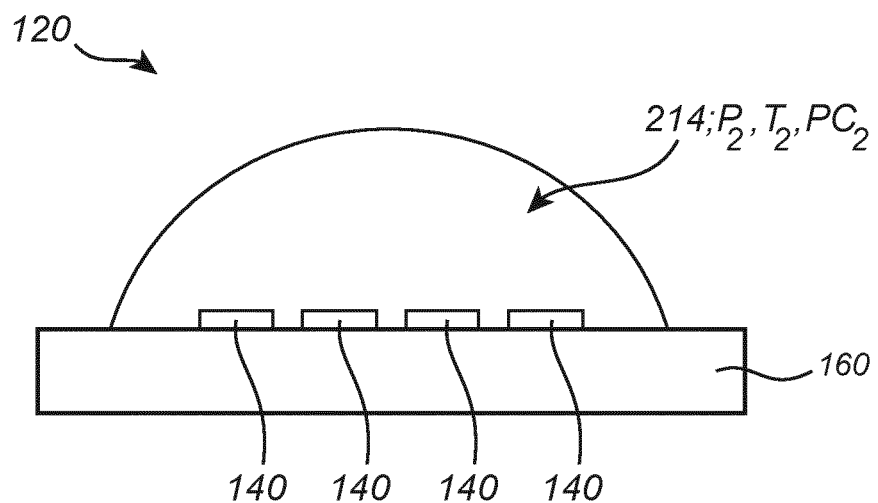

FIG. 4b shows a schematic view of a cross section of at least one LED filament 120 of the LED filament arrangement according to an exemplifying embodiment of the present invention. The at least one LED filament 120 comprises a second encapsulant portion 214. The second encapsulant portion 214 at least partially encloses the LEDs 140. The second encapsulant portion 214 has a second thickness, $T_2$. The second encapsulant portion 214 further comprises a phosphor of a second phosphor type, $P_2$, and of a second phosphor concentration, $PC_2$. In FIGS. 4a and 4b, the first and second thicknesses, $T_1$, $T_2$, of the first and second encapsulant portions, 212, 214, respectively, fulfill $T_1 \neq T_2$. For example, the ratio between $T_1$ and $T_2$ may be <0.8 or >1.2. Furthermore, the second phosphor type, $P_2$, and the second phosphor concentration, $PC_2$, of the second encapsulant portion 214 may differ from the first phosphor type, $P_1$, and the first phosphor concentration, $PC_1$, of the first encapsulant portion 212. For example, the ratio between $PC_1$ and $PC_2$ may be <0.8 or >1.2.

Figure 5:
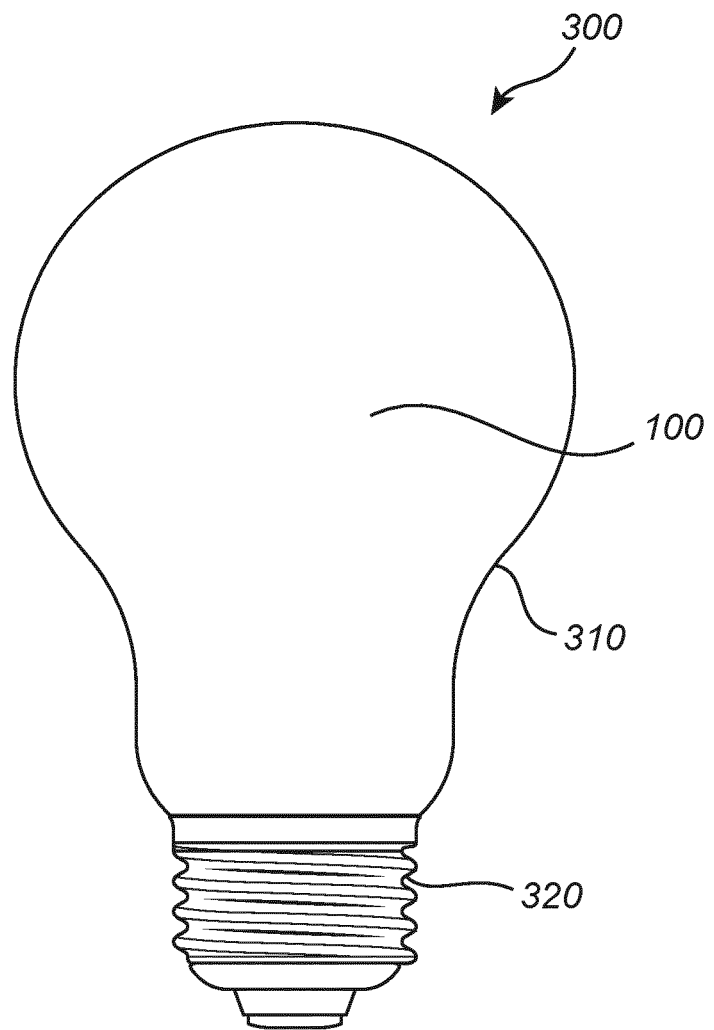
FIG. 5 shows a lighting device comprising a LED filament arrangement according to an exemplifying embodiment of the present invention.

FIG. 5 schematically shows a lighting device 300 according to an embodiment of the present invention. The lighting device 300 comprises a LED filament arrangement 100 according to any one of the previously described embodiments. The lighting device 300 further comprises a cover 310, which is exemplified as being bulb-shaped. The cover 310 may comprise an at least partially light transmissive (e.g. transparent) material and at least partially encloses the LED filament arrangement 100. The lighting device 300 further comprises an electrical connection 320 connected to the LED filament arrangement 100 for a supply of power to the plurality of LEDs of the LED filament arrangement 100.

The person skilled in the art realizes that the present invention by no means is limited to the preferred embodiments described above. On the contrary, many modifications and variations are possible within the scope of the appended claims. For example, one or more of the LED filament(s) 120 may have different shapes, dimensions and/or sizes than those depicted/described.

The invention claimed is:

1. A light emitting diode, LED, filament arrangement comprising
at least one LED filament comprising a plurality of light emitting diodes, LEDs,
a plurality of first sections of the at least one LED filament, wherein the plurality of first sections is configured to emit light of a first colour temperature, $CT_1$, and with a first intensity, $I_1$, during operation, and
a plurality of second sections of the at least one LED filament, wherein the plurality of second sections is configured to emit light of a second colour temperature, $CT_2$, and with a second intensity, $I_2$, during operation,
wherein at least one of $CT_1 \neq CT_2$ and $I_1 \neq I_2$ is fulfilled,
wherein the plurality of first sections and the plurality of second sections are arranged in an alternating manner along the length of the respective LED filament and at least two second sections of the plurality of second sections are adjacently arranged and arranged at least partially parallel to each other,
said LED filament arrangement further comprising an encapsulant at least partially enclosing the plurality of LEDs, wherein the encapsulant comprises at least one of a luminescent material configured to at least partly convert light emitted from the plurality of LEDs and a light scattering material configured to scatter light emitted from the plurality of LEDs, wherein the encapsulant comprises a first encapsulant portion and a second encapsulant portion,
wherein at least a first section of the plurality of first sections comprises the first encapsulant portion and at least a second section of the plurality of second sections comprises the second encapsulant portion, and
wherein at least one of:
the first encapsulant portion comprises a phosphor of a first phosphor type, $P_1$, and the second encapsulant portion comprises a phosphor of a second phosphor type, $P_2$, wherein $P_1 \neq P_2$,
the first encapsulant portion comprises a first thickness, $T_1$, and the second encapsulant portion comprises a second thickness, $T_2$, wherein $T_1 \neq T_2$, and
the first encapsulant portion comprises a phosphor with a first phosphor concentration, $PC_1$, and the second encapsulant portion comprises a phosphor with a second phosphor concentration, $PC_2$, wherein $PC_1 \neq PC_2$, is fulfilled, and
wherein a number of LEDs, $dN_1$, per unit length, $dL_1$, of the plurality of first sections, $dN_1/dL_1$, and a number of LEDs, $dN_2$, per unit length, $dL_2$, of the plurality of second sections, $dN_2/dL_2$, fulfil $dN_1/dL_1 \neq dN_2/dL_2$.

2. The LED filament arrangement according to claim 1, wherein at least one of
$|CT_1 - CT_2| > 300$ K, and
one of $I_1/I_2 < 0.8$ and $I_1/I_2 > 1.2$,
is fulfilled.

3. The LED filament arrangement according to claim 1, wherein at least three second sections of the plurality of second sections are adjacently arranged and arranged at least partially parallel to each other.

4. The LED filament arrangement according to claim 1, wherein at least two first sections of the plurality of first sections are adjacently arranged and arranged at least partially parallel to each other.

5. The LED filament arrangement according to claim 1, wherein a width of at least one first section of the plurality of first sections, $W_1$, and a width of at least one second section of the plurality of second sections, fulfils $W_2 < W_1$.

6. The LED filament arrangement according to claim 1, wherein a length of at least one second section of the plurality of second sections, $L_2$, and a length of at least one first section of the plurality of first sections, $L_1$, fulfils $L_2 < L_1$.

7. The LED filament arrangement according to claim 1, wherein a length of the at least one second section of the plurality of second sections, $L_2$, fulfils $L_2 < 3$ cm.

8. The LED filament arrangement according to claim 1, further comprising a carrier arranged to support the at least one LED filament, wherein the at least one LED filament is arranged on the carrier.

9. The LED filament arrangement according claim 8, wherein at least one of the carrier and the at least one LED filament is flexible.

10. The LED filament arrangement according to claim 1, wherein the at least one LED filament is arranged in at least one of a linear configuration, a meander configuration, a spiral configuration and a sinusoidal configuration.

11. A lighting device comprising
a LED filament arrangement according to claim 1,
a cover comprising an at least partially light-transmissive material, wherein the cover at least partially encloses the at least one LED filament, and
an electrical connection connected to the at least one LED filament for a supply of power to the plurality of LEDs of the at least one LED filament.

* * * * *